(12) United States Patent
Lee

(10) Patent No.: US 8,835,949 B2
(45) Date of Patent: Sep. 16, 2014

(54) THREE-TERMINAL LIGHT EMITTING DEVICE (LED) WITH BUILT-IN ELECTROSTATIC DISCHARGE (ESD) PROTECTION DEVICE

(71) Applicant: Sharp Laboratories of America, Inc., Camas, WA (US)

(72) Inventor: Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/773,414

(22) Filed: Feb. 21, 2013

(65) Prior Publication Data

US 2014/0231832 A1    Aug. 21, 2014

(51) Int. Cl.
*H01L 27/15*    (2006.01)
*H01L 33/42*    (2010.01)

(52) U.S. Cl.
CPC ............ *H01L 27/15* (2013.01); *H01L 33/42* (2013.01)
USPC .......... 257/92; 257/79; 257/88; 257/E27.121; 438/23; 438/34

(58) Field of Classification Search
CPC ........................... H01L 27/156; H01L 25/167
USPC ............. 257/79, 88, 92, E27.121; 438/23, 35
See application file for complete search history.

(56) References Cited

U.S. PATENT DOCUMENTS

| 7,151,281 | B2 | 12/2006 | Shei et al. |
| 2006/0163604 | A1 | 7/2006 | Shin et al. |
| 2007/0069218 | A1 | 3/2007 | Chen et al. |
| 2007/0090488 | A1 | 4/2007 | Teng et al. |
| 2010/0102336 | A1* | 4/2010 | Lee et al. ............... 257/88 |

OTHER PUBLICATIONS

S.J. Chang et al., "Improved ESD protection by combining InGaN-GaN MQW LEDs with GaN Schottky diodes," IEEE Electron Device Letters, vol. 24, No. 3, 129-131 (2003).
Y.K. Su et al., "ESD engineering of nitride-based LEDs," IEEE Trans. Device and Materials Reliability, vol. 5, No. 2, 277-281 (2005).
S.J. Chang et al., "Highly reliable nitride-based LEDs with Internal ESD protection diodes," IEEE Trans. Device and Materials Reliability, vol. 6, No. 3, 442-447 (2006).

(Continued)

*Primary Examiner* — Cheung Lee
*Assistant Examiner* — Stephen Bradley
(74) *Attorney, Agent, or Firm* — Law Office of Gerald Maliszewski; Gerald Maliszewski

(57) ABSTRACT

A three-terminal light emitting device (LED) chip, associated fabrication method, and LED array are provided. The method forms an n-doped semiconductor layer overlying a substrate, an active semiconductor layer overlying the n-doped semiconductor layer, and a p-doped semiconductor layer overlying the active semiconductor layer. A trench is formed through the p-doped and active semiconductor layers, exposing the n-doped semiconductor layer. In one aspect, the trench is formed at least part way, but not completely, through the n-doped semiconductor layer. Then, an LED P electrode is formed overlying a first region of the p-doped semiconductor layer, a diode P electrode is formed overlying a second region of the p-doped semiconductor layer that is separated from the first region of the p-doped semiconductor layer by the trench, and an N electrode is formed overlying a top surface of the exposed n-doped semiconductor layer in the trench, shared by the LED and diode.

7 Claims, 6 Drawing Sheets

(56) References Cited

OTHER PUBLICATIONS

C.M. Tsai et al., "High efficiency and improved ESD characteristics of GaN-based LEDs with naturally . . . ", IEEE Photonics Technology Letters, vol. 18, No. 11, 1213-1215 (2006).

S.C. Shei et al., "Improved reliability and ESD characteristics of flip-chip GaN-based LEDs with . . . ," IEEE Electron Device Letters, vol. 28, No. 5, 346-349 (2007).

S. Hwang and J. Shim, "Improved ESD voltage by inserting floating metal ring in GaN-based ligh emitting diodes," Electronics Letters, vol. 44, No. 9, 2008.

G.F.X. Strobl et al., "Evolution of fully European triple GaAs solar Cell," Proceedings Seventh European Space Power Conference, ESA SP-589, Stresa, Italy, May 2005.

* cited by examiner

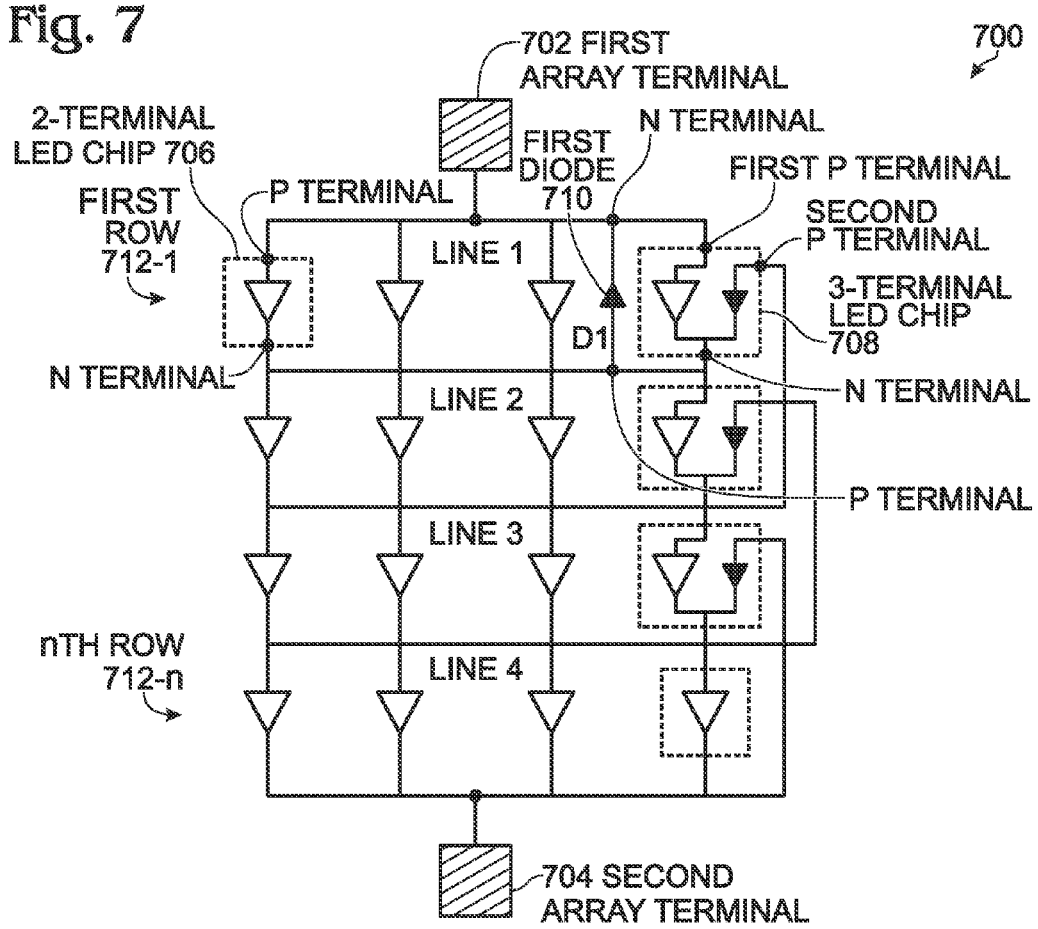
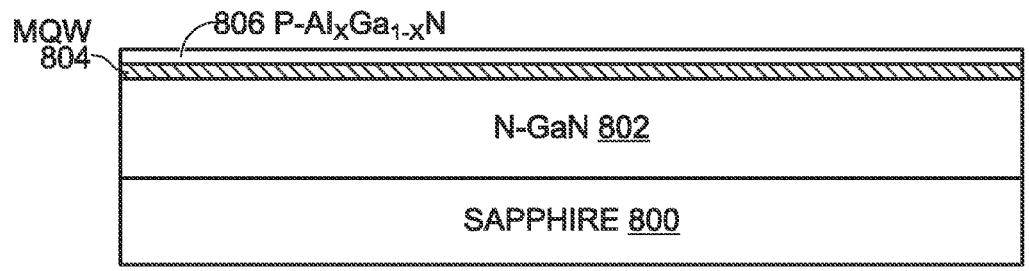

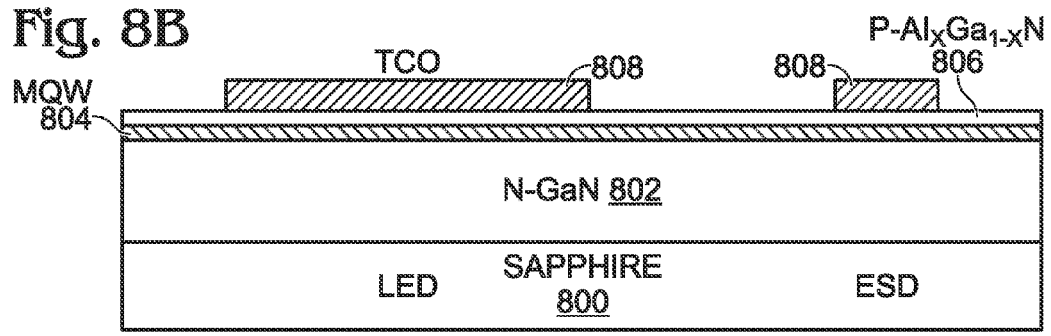
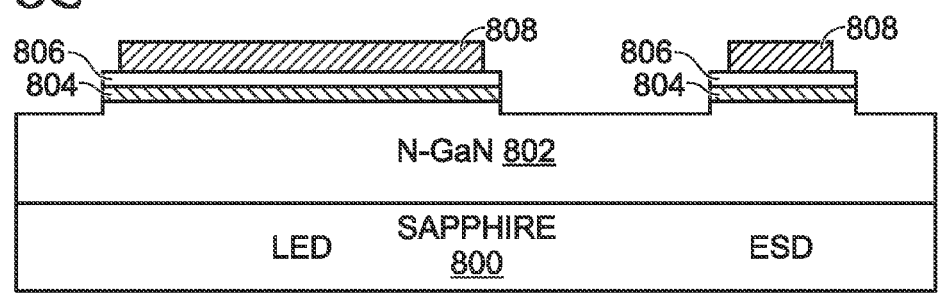
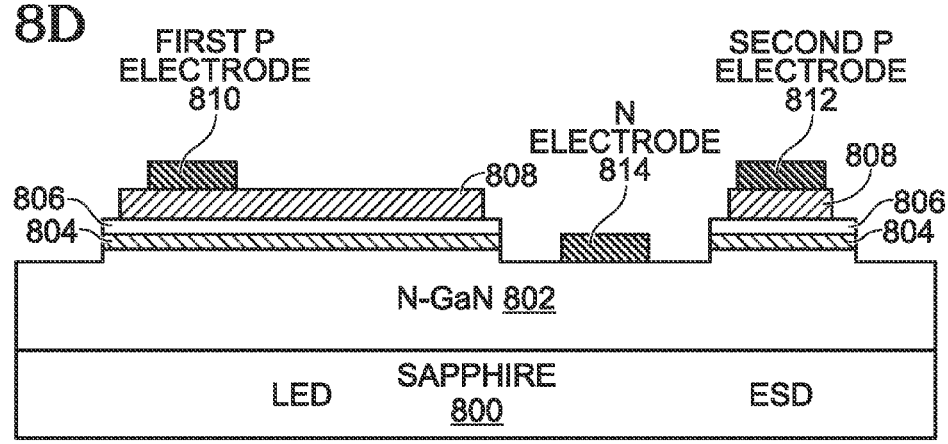

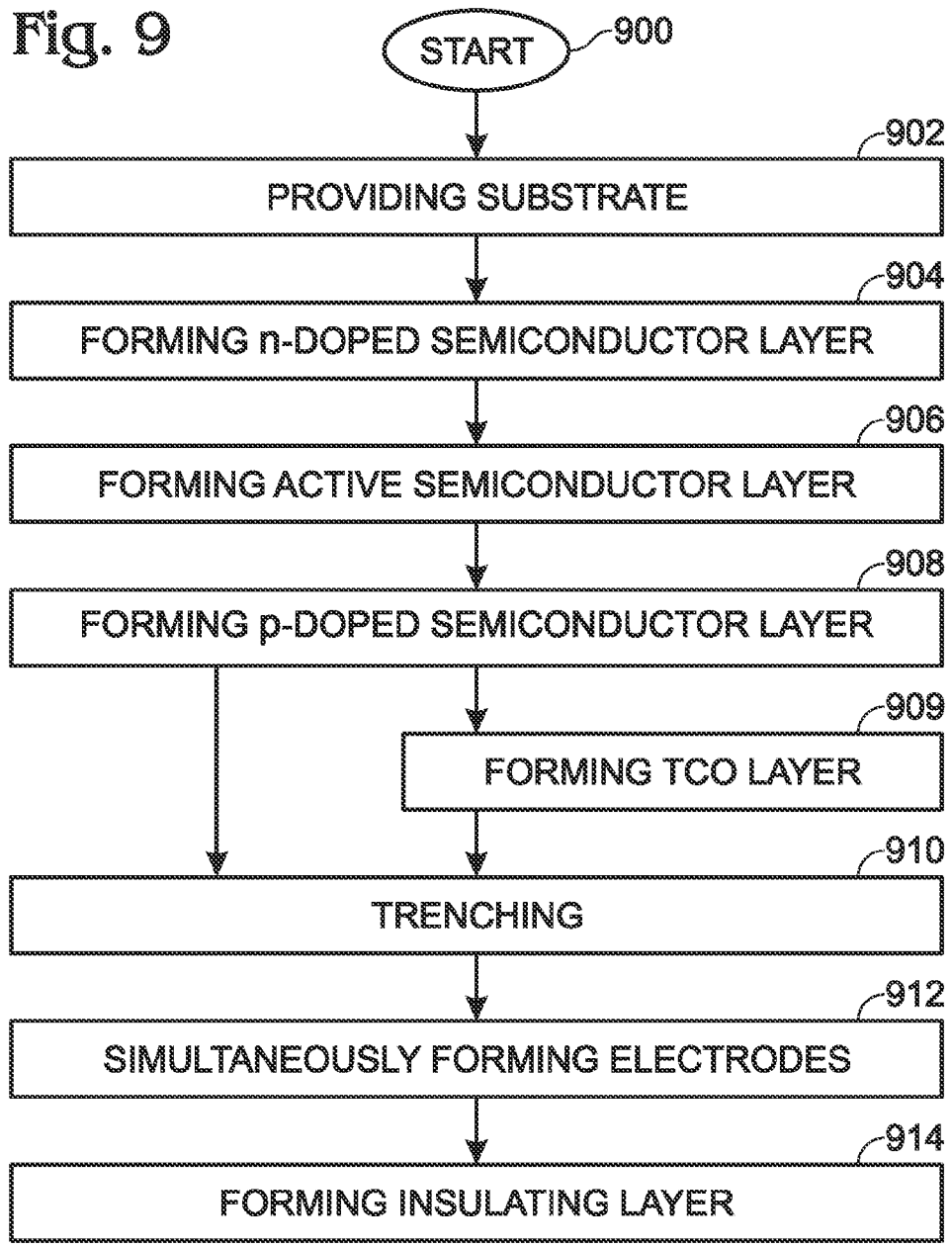

THREE-TERMINAL LIGHT EMITTING DEVICE (LED) WITH BUILT-IN ELECTROSTATIC DISCHARGE (ESD) PROTECTION DEVICE

BACKGROUND OF THE INVENTION

1. Field of the Invention

This invention generally relates to a light emitting device (LED) and, more particularly, to a three-terminal LED with built-in electrostatic discharge (ESD) protection for LED array applications.

2. Description of the Related Art

FIG. 1 is a schematic diagram depicting an equivalent circuit for a matrix type light emitting diode (LED), which is also known as a light emitting device (prior art). The luminous efficiency of LEDs has been enhanced drastically in recent years, and it is expected that the LED will replace the conventional incandescent bulb and fluorescent lamp in the future. To generate enough light from an LED to replace an incandescent bulb or fluorescent lamp for general lighting purpose, the area of the LED must be sufficiently large. However, the uniformity of light generated by an LED deteriorates as the LED area size increases. In addition, the heat generated by a large LED is concentrated, and has an adverse effect of LED performance. Therefore, it is a common practice to fabricate small LEDs and electrically connect them to form a matrix or an array as shown in the figure. The diode symbol in the figure represents a light emitting device or LED diode. The matrix can have M columns and N rows, where $M \geq 1$, $N \geq 1$, and $M \times N \geq 2$. The integration of the LED matrix can be monolithic, meaning that the LEDs are fabricated on a common substrate and electrically connected on the same substrate. Alternatively, the LED matrix can be formed at the packaging level, meaning that LED diodes are dicing from a growth substrate, LED dies are mounted on a package, and the electrical connections are made on the package. No matter what kind of connection is made, the final LED matrix has two external pads for electrical connection.

FIG. 2 is a schematic drawing depicting the LED array of FIG. 1 with a two-way Zener diode to protect the LEDs during an electrostatic discharge (ESD) event (prior art). For lighting applications, group III nitride semiconductors (III-nitride) have attracted much attention because the bandgap energy of $Al_xGa_{1-x}In_yN$ varies from 0.78 electron volts (eV) of InN to 6.3 eV of AlN. Thus, the emitting wavelength of III-nitride LEDs can be easily adjusted by changing the composition ratio among aluminum (Al), gallium (Ga), and indium (In). Although GaN based LEDs are commercially available, ESD is still a problem due to the fact that the GaN is usually grown on an insulating substrate, such as sapphire or SiC. When an ESD event comes to contact with the LED pad, a surge voltage can destroy the device instantly. To protect the LED matrix, an externally connected two-way Si Zener diode may be placed between two pads as shown in the figure.

FIGS. 3A and 3B are schematic diagrams depicting a protection diode that is reverse and parallelly connected to an LED (prior art). In FIG. 3A each LED diode has one protection diode. In FIG. 3B each row of LEDs has one protection diode. When an ESD event comes to contact with the LED pad, and the LED diode is forward biased, the LED diode discharges the ESD current. If the ESD event comes to contact with the LED pad, and the LED is reverse biased, then the parallel-connected ESD protection diode is forward biased and discharges the ESD charge. In additional to protection from an ESD event, the protection diode can protect the array from degradation due to the "partial shading effect" described below. An LED is a PN diode that is fabricated on a semiconductor material, and it typically operates in the forward bias condition. If light illuminates an LED while it is off, the LED behaves like a solar cell, which can convert the photo energy to electrical energy. If an LED is in a series-connected string that is shaded, with the remaining LEDs still under the light, the shaded LED is forced into reverse bias breakdown so that it can conduct the current of the string. The reverse biasing of the LED can permanently damage the cell. The two-way Si Zener diode in FIG. 2 cannot protect the LED from damage due to this effect. This effect is commonly seen in the solar cell industry. To prevent this type of stressing on a shaded solar cell, the common solution is to reverse and parallelly connect a discrete diode. A reverse and parallelly connected discrete diode protects an LED from ESD damage, as well as the damage due to the voltage build up on a shaded LED when other LEDs are under illumination.

FIGS. 4A and 4B are, respectively, partial cross-sectional and schematic views LED and ESD diodes are fabricated on the same substrate. The PN diodes are reverse and parallelly connected together. The protection diode in FIG. 3A or 3B can be a diode made of different semiconductor material than the LED diode. For example, the protection diode can be Si diode and the LED can be GaN LED on sapphire substrate. The LED dies and the protection diodes can be package together. Although the Si diode is cheap comparing to the LED diode, the packaging of the two together can be costly. To reduce the cost of the LED matrix, the protection diode and the LED can be made of same semiconductor materials and can be fabricated together. It is well known to monolithically integrate LEDs with a reverse and parallelly connected ESD diode. The ESD diode can be a PN diode or a Schottky diode.

Shown is a GaN LED (150) that is protected with an ESD diode (160), which is fabricated on the same insulating substrate (101). 103 is an n-type GaN-based clad layer; 105 is an active layer; 107 is a p-type GaN-based clad layer; 109 is a transparent electrode; and 110, 112, 114, and 116 are metal electrodes. 110 and 114 are connected by 120, and 112 and 116 are connected by 130. An isolation etch at 140 ensures isolation between LED and ESD diodes. The film thicknesses are not drawn to scale, with GaN layer 103 being much thicker than the overlying films. The disadvantage of using this approach is that a deep GaN etch is needed to ensure the isolation between the LED and ESD diodes. In addition, the metal deposition process must typically be performed in two steps.

It would be advantageous if a monolithic chip or die could be made that included both an LED and protection diode, without the requirement of a deep isolation etch through the n-doped semiconductor substrate.

SUMMARY OF THE INVENTION

Disclosed herein is a single chip light emitting diode or light emitting device (LED) with a diode for electrostatic discharge (ESD) protection, that is fabricated using a simplified process that eliminates the deep etching step shown as the feature 140 in FIG. 4A. The two diodes have their N regions connecting together, since there is no deep isolation etch through the n-doped semiconductor substrate. The chip has three metal pads that are used for electrical connection: a first P-pad for the LED diode, a second P-pad for ESD diode, and an N-pad for both LED and ESD diodes.

Accordingly, a method is provided for fabricating a three-terminal light emitting device chip. The method forms an n-doped semiconductor layer overlying a substrate, an active semiconductor layer overlying the n-doped semiconductor layer, and a p-doped semiconductor layer overlying the active semiconductor layer. A trench is formed through the p-doped and active semiconductor layers, exposing the n-doped semiconductor layer. In one aspect, the trench is formed at least part way, but not completely, through the n-doped semiconductor layer. Then, an LED P electrode is formed overlying a first region of the p-doped semiconductor layer. A diode P electrode is formed overlying a second region of the p-doped semiconductor layer that is separated from the first region of the p-doped semiconductor layer by the trench, and an N electrode is formed overlying a top surface of the exposed n-doped semiconductor layer in the trench, shared by the LED and diode.

Additional details of the above-described method, a three-terminal LED chip, and an LED array with ESD protection are provided below.

BRIEF DESCRIPTION OF THE DRAWINGS

FIG. 7 is a schematic diagram of an LED array with ESD protection.

FIG. 8A through 8D depicts steps in the fabrication of the tree-terminal LED chips of FIG. 5A or FIG. 6.

FIG. 9 is a flowchart illustrating a method for fabricating a three-terminal LED chip.

DETAILED DESCRIPTION

Figure 5A:
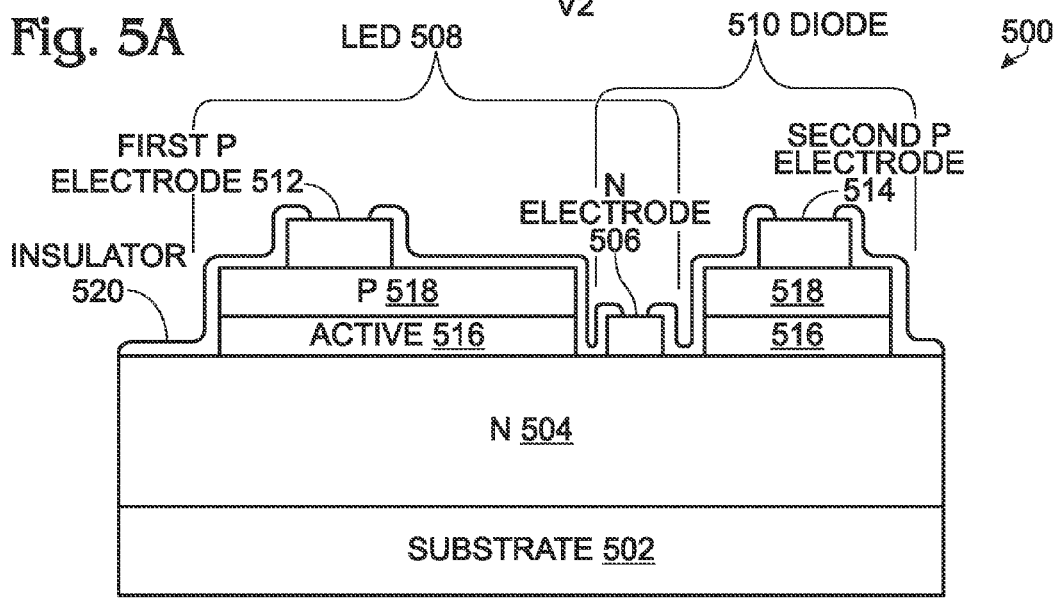
FIGS. 5A and 5B are, respectively, a partial cross-sectional view of a three-terminal LED chip and a schematic diagram.
Figure 5B:
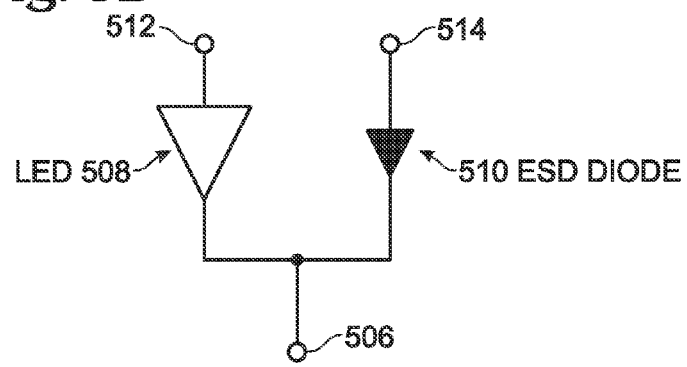

FIGS. 5A and 5B are, respectively, a partial cross-sectional view of a three-terminal LED chip and a schematic diagram. The LED chip 500 comprises a substrate 502. The substrate 502 may be an insulating material such as quartz, glass, or sapphire, or a semi-insulating material such as silicon (Si), germanium (Ge), Group III-IV compound semiconductors, or Group II-IV compound semiconductors. An n-doped semiconductor layer (N) 504 overlies the substrate 502. An N electrode 506 overlies and is in direct contact with the n-doped semiconductor layer 504. An LED 508 overlies the n-doped semiconductor layer 504, with a first P electrode 512. A diode 510 overlies the n-doped semiconductor layer 504, with a second P electrode 514. The LED 508 and the diode 510 share the N electrode 506.

In one aspect, the LED 508 comprises an active semiconductor layer 516 overlying and in direct contact with the n-doped semiconductor layer 504. A p-doped semiconductor layer 518 overlies and is in direct contact with the active semiconductor layer 516.

As in a typical diode, current flows from the p-doped material to the n-doped material when an LED is forward biased. When an electron meets a hole, it falls into a lower energy level, and releases energy in the form of a photon. The color of light emitted depends on the bandgap energy of the materials forming the p-n junction. In silicon or germanium diodes, the electrons and holes recombine by a non-radiative transition, which produces no optical emission, because these are indirect band gap materials. The materials used for the LED have a direct bandgap. The active semiconductor layer 516 is the p-n junction area where electrons recombine with holes and radiate light. However, its specific structure is outside the scope of this disclosure. In one aspect, the active semiconductor layer 516 may be a multi-quantum well (MQW) structure. The purpose of the MQW is to "trap" electrons and holes, so they can recombine. In addition, the bandgap of the MQW material is controlled to create a desired light emission color. For example, for a GaN LED, the color may vary from deep blue to green, with the color being controlled by the indium (In) concentration in the $Ga_xIn_{1-x}N$ MQW structure. The bandgap shrinks with an increase in In concentration in the $Ga_xIn_{1-x}N$.

Likewise, the diode 510 comprises an active semiconductor layer overlying 516 and in direct contact with the n-doped semiconductor layer 504. A p-doped semiconductor layer 518 overlies and is in direct contact with the active semiconductor layer 516. An insulator layer 520 overlies a top surface of the LED chip 500, with opening to expose the N electrode 506, first P electrode 512, and second P electrode 514.

Figure 6:
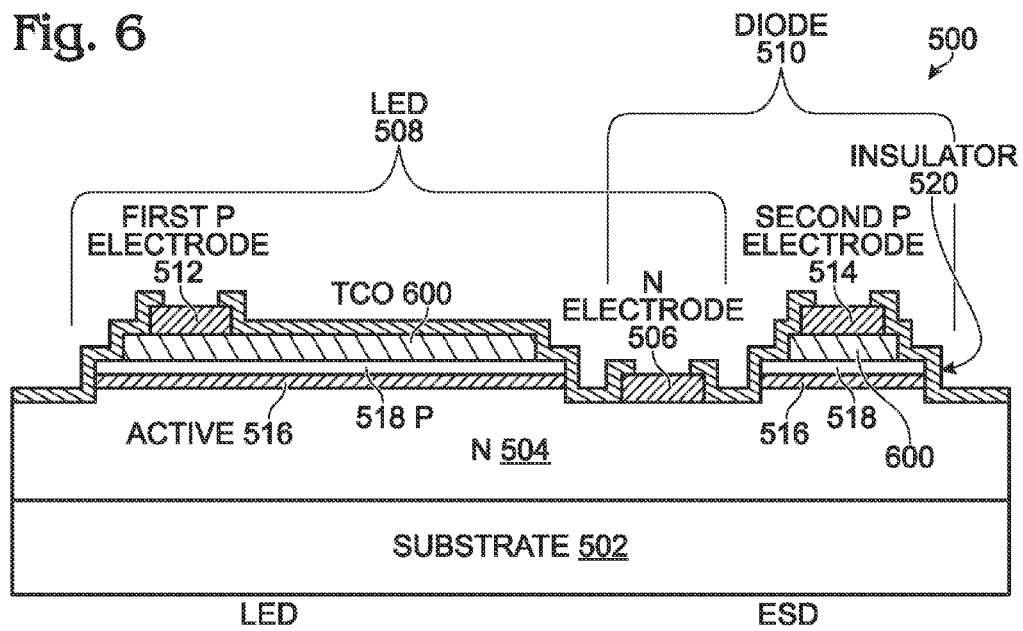
FIG. 6 is a partial cross-sectional view depicting a variation of the three-terminal LED chip of FIG. 5A.

FIG. 6 is a partial cross-sectional view depicting a variation of the three-terminal LED chip of FIG. 5A. In this aspect, the LED 508 further comprises a transparent conductive oxide (TCO) layer 600 interposed and in direct contact with the p-doped layer 518 and first P electrode 512. Likewise, the diode 510 further comprises a TCO layer 600-interposed and in direct contact with the p-doped layer 518 and second P electrode 514.

FIG. 7 is a schematic diagram of an LED array with ESD protection. The LED array 700 comprises a first array terminal 702, and a second array terminal 704. The LED array 700 comprises a plurality of two-terminal LED chips 706, where each two-terminal LED chip 706 comprises an LED interposed between a P terminal and an N terminal. The LED array 700 also comprises a plurality of three-terminal LED chips 708, where each three-terminal LED chip comprises an LED interposed between a first P terminal and an N terminal, and a diode interposed between a second P terminal and the N terminal. A first diode (D1) 710 is interposed between a P terminal and an N terminal.

The LED array is made up of n rows of parallelly connected LED chips. The first row 712-1 includes a plurality of two-terminal LED chips 706, at least one three-terminal LED chip 708, and the first diode 710. The P terminals of the two-terminal LED chips 706, the first P terminal of the three-terminal LED chip 708, and the N terminal of the first diode 710 are connected to the first array terminal. The array 700 also comprises (n−2) sequential rows between the first and nth rows. Each row includes a plurality of two-terminal LED chips 706 and at least one three-terminal LED chip 708. The P terminals of the two-terminal LED chips 706 and the first P terminal of three-terminal LED chip 708 are connected to the N terminals of the LED chips 706/708 in a preceding row. The N terminal of each LED chip 706/708 is connected to the second P terminal of a three-terminal LED chip 708 in the preceding row. Finally, the array 700 comprises an nth row 712-n including a plurality of two-terminal LED chips 706. The P terminal of each two-terminal LED chip is connected to the N terminals of the LED chips 706/708 in the (n−1)th row, and the N terminal of each two-terminal LED chip 706 is connected to the second array terminal 704. In this example, n=4. However, it should be understood that the value of n is not limited to any particular integer. Likewise, the example depicts 4 LED chips per row, but the array need not be limited to this value.

Figure 1:
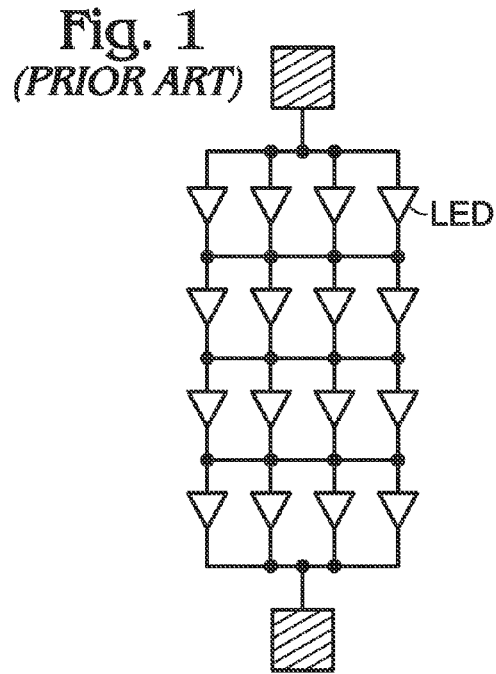
FIG. 1 is a schematic diagram depicting an equivalent circuit for a matrix type light emitting diode (LED), which is also known as a light emitting device (prior art).
Figure 2:
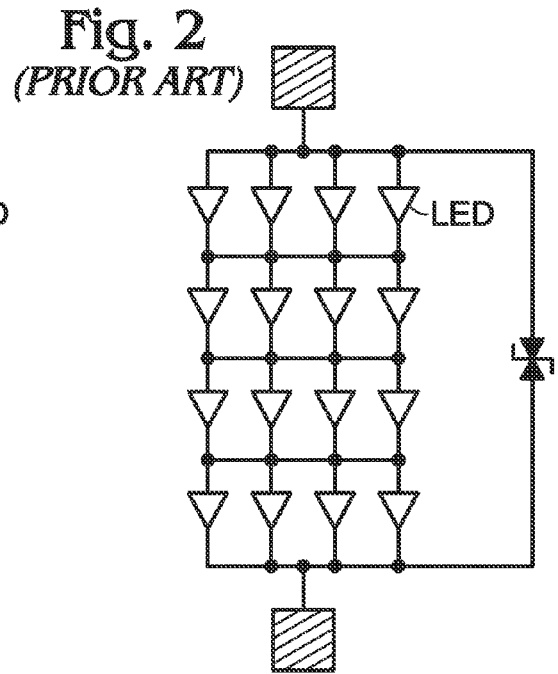
FIG. 2 is a schematic drawing depicting the LED array of FIG. 1 with a two-way Zener diode to protect the LEDs during an electrostatic discharge (ESD) event (prior art).
Figure 3A:
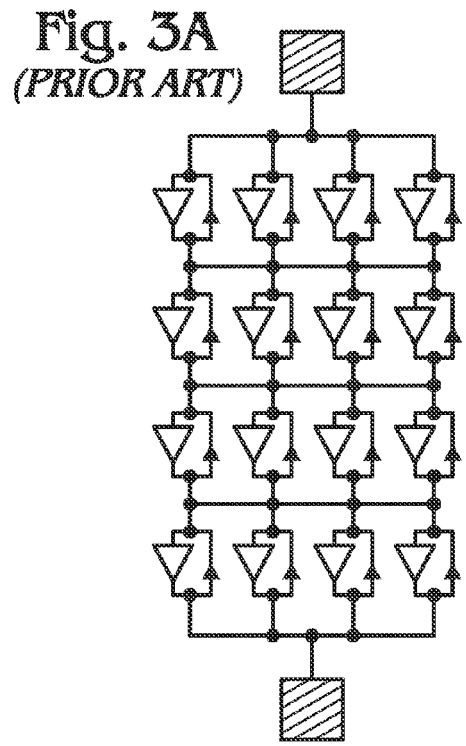
FIGS. 3A and 3B are schematic diagrams depicting a protection diode that is reverse and parallelly connected to an LED (prior art).
Figure 3B:
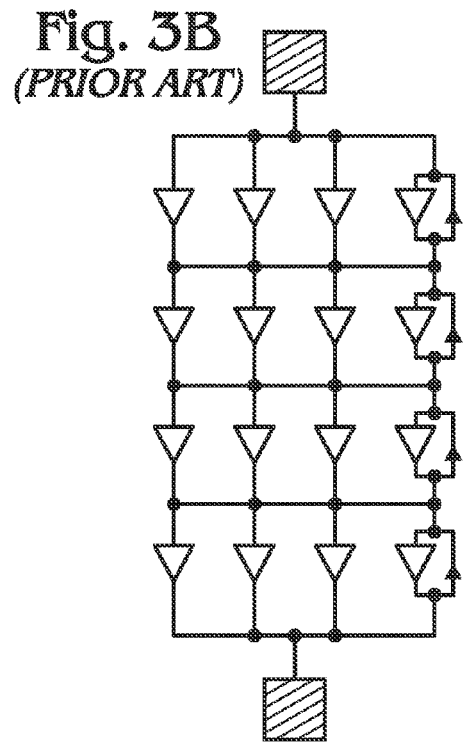
Figure 4A:
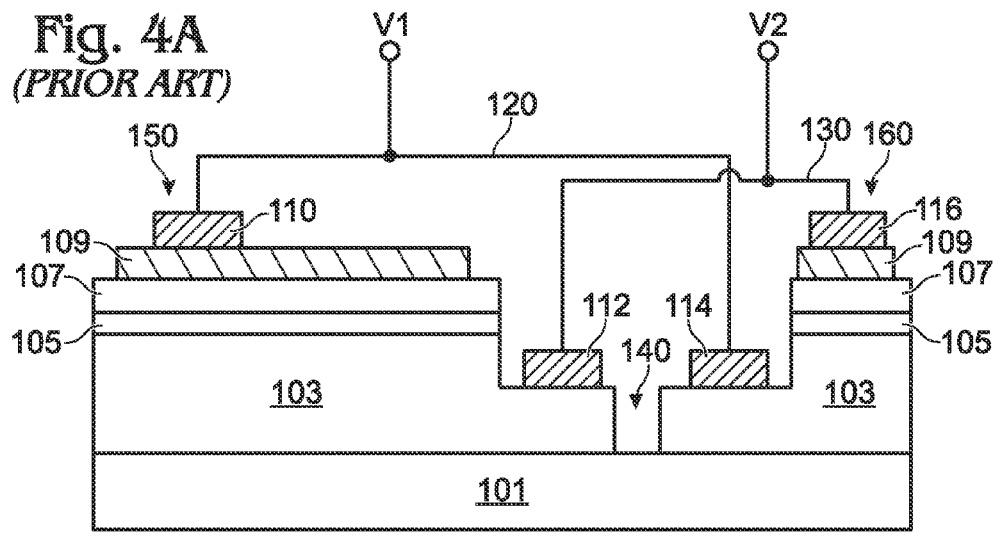
FIGS. 4A and 4B are, respectively, partial cross-sectional and schematic views LED and ESD diodes are fabricated on the same substrate.
Figure 4B:
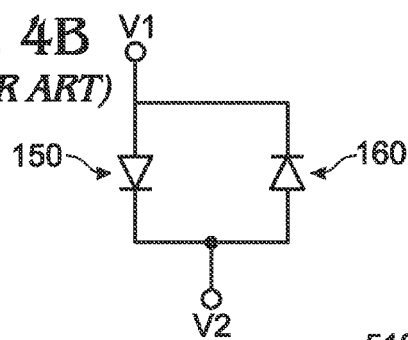

In one aspect, the three-terminal LED chips may be enabled as described above on the explanations of FIGS. 5A, 5B, and 6. A repetition of these explanations is not provided in the interest of brevity. Returning briefly to FIGS. 5A and 6, the LED fabrication process is simplified by eliminating the deep etching step shown as the feature 140 in FIG. 4A (prior art). The two diodes have their N regions connected together since there is no deep isolation. The process steps of the three-terminal LED chip may be exactly the same as the process for an equivalent two-terminal LED chip without the ESD protection diode As shown in FIG. 7, there are three components in the LED array. The two-terminal LED chip is an LED chip without an ESD diode, the three-terminal LED chip is an LED chip with an ESD protection diode, and the first diode D1 is a diode that can be fabricated from any semiconductor material. The LED matrix has M columns and n rows (M=n=4, in this example). The placement of the three-terminal LED chips is not limited to any particular column, although they are shown in the right-most column in the figure. In the last (nth) row, the three-terminal LED can be replaced by a two-terminal LED. Alternatively but not shown, a three-terminal may be used, without connecting the second P terminal of the ESD diode. The first diode D1, located in the first row, is reverse and parallelly connected to the two-terminal LED chips in that row, meaning that the N terminal of the first diode D1 is connected to the P terminals of the two-terminal LED chips, and the first P terminal of the three-terminal LED chip.

The three-terminal LED chip at Row X, where X may vary from 1 to (n−1) has the following connections: the N-pad connects to Line X+1 (the P-pads of the LED chips of Row X+1), the first P-pad connects to Line X (the P-pads of the LED chips in Row X), and the second P-pad connects to Line X+2 (the P-pads of the LED chips in Row X+2). Effectively, the ESD diode of the three-terminal LED in Row X protects the LEDs in Row X+1. The LEDs in the first row are protected by the first diode D1. In this arrangement, only one protection diode (D1) has to be packaged in the LED matrix. In conditions where an LED diode is reverse biased, the parallelly connected ESD diode is forward biased, and current flow through the ESD diode protects the LEDs.

FIG. 8A through 8D depicts steps in the fabrication of the tree-terminal LED chips of FIG. 5A or FIG. 6. With a general emphasis on GaN LEDs for general lighting applications, a GaN LED process flow is described herein. However, it should be understood that the basic steps and materials presented herein made be modified for different applications. As shown in FIG. 8A, the GaN LED fabrication starts with a substrate. The substrate 800 comprises, for example but is not limited to, sapphire (single crystal aluminum oxide), silicon carbide (SiC), or silicon substrates. An N-type GaN layer 802 is deposited, followed by a multi quantum well (MQW) light emitting layer 804 and a p-type $Al_xGa_{1-x}N$ layer 806. The multi quantum well structure 804 is, for example, multiple $GaN/In_yGa_{1-y}N$ stacks, with each layer thickness is between 2 nanometers (nm) and 10 nm, repeated 2 to 15 times.

Following the p-type $Al_xGa_{1-x}N$ layer deposition, transparent conducting oxide (TCO) 808 may be deposited and patterned as shown in FIG. 8B. Alternatively, the device may be fabricated without a TCO film. A semi-transparent metal layer, for example a thin Ni/Au layer or thin Ni/Pt layer, can also be used here to replace the TCO layer. The TCO material may be $In_2O_3$, $SnO_2$, ITO, or ZnO:Al. Following the TCO patterning, mesa isolation etching of the p-type $Al_xGa_{1-x}N$ and MQW layers is performed, as shown in FIG. 8C. The LED and ESD areas have been defined. However, the N-regions of the LED and ESD diodes are connected together since the mesa etching does not etch through the N-type GaN 804.

Then, as shown in FIG. 8D, metal is deposited and electrodes are patterned on the substrate. There are three electrodes for every three-terminal LED chip, and they are formed in the same process step. They are: the first P electrode 810, the second P electrode 812, and the N electrode 814. The electrodes materials may be, but not limited to, Ti/Al, Ti/Al/Ti/Au, Ti/Al/Pt/Au, Ti/Al/Ni/Au, Cr/Pd/Au, Cr/Ti/Au, Pd/Al/Ti/Au, Pd/Al/Ni/Au, or Zr/Al/Ti/Au.

After electrode patterning, a passivation layer (520) is deposited and the metal electrode areas are opened as shown in FIG. 5A. The passivation (insulation) layer can be $SiO_2$ or $Si_3N_4$. Then, the substrate is diced, with each LED chip including one LED diode and one ESD diode. The N-regions of the LED diode and ESD diode are connected together at a single electrode pad. The P-region of the LED diode and the P-region of the ESD diode have separate electrode pads.

The GaN LED process flow described here is simplified, as compared to conventional processes. For example, in a conventional process, the N—GaN layer includes a nucleation layer, a buffer layer, and a confinement layer. The nucleation layer is deposited over the substrate, the buffer layer is deposited over the nucleation layer, and a confinement layer is deposited over the buffer layer. These layers serve different purposes for GaN LED function. The compositions of these layers and the structure of other layers are described thoroughly in U.S. Pat. No. 7,151,281.

FIG. 9 is a flowchart illustrating a method for fabricating a three-terminal LED chip. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 900.

Step 902 provides a substrate, which may, for example, be an insulating substrate such as quartz, glass, and sapphire, or a semi-insulating substrate such as Si, Ge, Group III-IV compound semiconductors, and Group II-IV compound semiconductors. Step 904 forms an n-doped semiconductor layer overlying the substrate. Step 906 forms an active semiconductor layer overlying the n-doped semiconductor layer. Step 908 forms a p-doped semiconductor layer overlying the active semiconductor layer. Step 910 forms a trench through the p-doped and active semiconductor layers, exposing the n-doped semiconductor layer. In one aspect, Step 910 forms trench at least part way, but not completely, through the n-doped semiconductor layer.

Step 912 simultaneously forms: an LED P electrode overlying a first region of the p-doped semiconductor layer, a diode P electrode overlying a second region of the p-doped semiconductor layer that is separated from the first region of the p-doped semiconductor layer by the trench, and an N electrode overlying a top surface of the exposed n-doped semiconductor layer in the trench. Step 914 forms an insulator layer overlying a top surface of the LED chip, which exposes the N electrode, the LED P electrode, and the diode P electrode.

In one aspect, prior to forming the trench in Step 910, Step 909 forms a layer of transparent conductive oxide (TCO) film or a thin layer of semi-transparent metal overlying the p-doped semiconductor. Then, forming the P electrodes in Step 912 includes forming the LED P electrode overlying and in direct contact with a first region of the TCO film. The diode P electrode overlies and is in direct contact with a second region of the TCO film that is separated from the first region of TCO film by the trench.

A three-terminal LED chip, an associated fabrication process, and an array using the three-terminal LED chip have been provided. Examples of particular materials and process steps have been presented to illustrate the invention. However, the invention is not limited to merely these examples. Other variations and embodiments of the invention will occur to those skilled in the art.

I claim:

1. A light emitting diode (LED) array with electrostatic discharge (ESD) protection, the LED array comprising:
   a first array terminal;
   a second array terminal;
   a plurality of two-terminal LED chips, where each two-terminal LED chip comprises an LED interposed between a P terminal and an N terminal;
   a plurality of three-terminal LED chips, where each three-terminal LED chip comprises an LED interposed between a first P terminal and an N terminal, and a diode interposed between a second P terminal and the N terminal;
   a first diode interposed between a P terminal and an N terminal;
   n rows of parallelly connected LED chips comprising:
      a first row including a plurality of two-terminal LED chips, at least one three-terminal LED chip, and the first diode, where the P terminals of the two-terminal LED chips, the first P terminal of the three-terminal LED chip, and the N terminal of the first diode are connected to the first array terminal;
      (n−2) sequential rows, each row including a plurality of two-terminal LED chips and at least one three-terminal LED chip, where the P terminals of the two-terminal LED chips and the first P terminal of three-terminal LED chip are connected to the N terminals of the LED chips in a preceding row, and where the N terminal of each LED chip is connected to the second P terminal of a three-terminal LED chip in the preceding row; and,
      an nth row including a plurality of two-terminal LED chips, where the P terminal of each two-terminal LED chip is connected to the N terminals of the LED chips in the (n−1)th row, and the N terminal of each two-terminal LED chip is connected to the second array terminal.

2. The LED array of claim 1 wherein the LED of each three-terminal LED chip comprises:
   a substrate;
   an n-doped semiconductor layer overlying the substrate;
   an N electrode overlying and in direct contact with the n-doped semiconductor layer, and connected to the N terminal;
   an active semiconductor layer overlying and in direct contact with the n-doped semiconductor layer;
   a p-doped semiconductor layer overlying and in direct contact with the active semiconductor layer; and,
   a first P electrode overlying the p-doped semiconductor layer, and connected to the first P terminal.

3. The LED array of claim 2 further comprising:
   a transparent conductive oxide (TCO) layer overlying and in direct contact with the p-doped layer; and,
   wherein the first P electrode overlies and is in direct contact with the TCO layer.

4. The LED array of claim 2 wherein the diode of each three-terminal LED comprises:
   an active semiconductor layer overlying and in direct contact with the n-doped semiconductor layer;
   a p-doped semiconductor layer overlying and in direct contact with the active semiconductor layer; and,
   a second P electrode overlying the p-doped semiconductor layer, and connected to the second P terminal.

5. The LED array of claim 4 further comprising:
   a TCO layer overlying and in direct contact with the p-doped layer; and,
   wherein the second P electrode overlies and is in direct contact with the TCO layer.

6. The LED array of claim 4 wherein the each three-terminal LED chip further comprises:
   an insulator layer overlying a top surface of the LED IC chip, with opening the expose the N electrode, first P electrode, and second P electrode.

7. The LED array of claim 2 wherein the substrate is a material selected from a group consisting of an insulating substrate comprising quartz, glass, and sapphire, and a semi-insulating substrate comprising silicon (Si), germanium (Ge), Group III-IV compound semiconductors, and Group II-IV compound semiconductors.

* * * * *